(12) United States Patent
Chan et al.

(10) Patent No.: US 6,218,244 B1
(45) Date of Patent: Apr. 17, 2001

(54) METHOD OF FABRICATING TRANSISTOR

(75) Inventors: Bor-Wen Chan; Yuan-Hung Liu, both of Hsinchu (TW)

(73) Assignee: Taiwan Semiconductor Mfg Co Ltd, Hsinchu (TW)

( * ) Notice: Subject to any disclaimer, the term of this patent is extended or adjusted under 35 U.S.C. 154(b) by 0 days.

(21) Appl. No.: 09/482,757

(22) Filed: Jan. 13, 2000

(30) Foreign Application Priority Data

Dec. 10, 1999 (TW) .................................................. 08812709

(51) Int. Cl.$^7$ ................................................ H01L 21/8242
(52) U.S. Cl. .......................... 438/255; 438/253; 438/396; 438/398; 438/780
(58) Field of Search ..................................... 438/255, 253, 438/254, 396, 397, 398, 780, FOR 220

(56) References Cited

U.S. PATENT DOCUMENTS

| | | | |
|---|---|---|---|
| 4,211,582 | * 7/1980 | Horng et al. | 156/643 |
| 5,821,142 | * 10/1998 | Sung et al. | 438/255 |
| 5,851,877 | * 12/1998 | Ho et al. | 438/253 |
| 5,858,834 | * 1/1999 | Hirota et al. | 438/253 |
| 6,013,549 | * 1/2000 | Han et al. | 438/253 |
| 6,136,644 | * 10/2000 | Tseng et al. | 438/253 |

* cited by examiner

*Primary Examiner*—Michael Trinh
(74) *Attorney, Agent, or Firm*—Jiawei Huang; J C Patents

(57) ABSTRACT

A method of manufacturing a DRAM capacitor is described. A silicon substrate structure includes an oxide layer over a substrate and a polysilicon layer over the oxide layer. The polysilicon layer also includes a plug that penetrates the oxide layer. A patterned photoresist layer is next formed over the polysilicon layer. Spacers having a low etching rate are formed on the sidewalls of the photoresist layer by carrying out a chemical reaction next to the sidewall of the photoresist layer. A dry etching operation is carried out to etch the unreacted photoresist layer and the polysilicon layer exposed by the openings in the photoresist layer. Using the spacers as an etching mask, a portion of the polysilicon layer under the photoresist layer is removed by continuing the dry etching operation. Lastly, the spacers are removed to form a crown-shaped capacitor.

14 Claims, 4 Drawing Sheets

METHOD OF FABRICATING TRANSISTOR

CROSS-REFERENCE TO RELATED APPLICATION

This application claims the priority benefit of Taiwan application serial no. 88121709, filed Dec. 10, 1999.

BACKGROUND OF THE INVENTION

1. Field of the Invention

The present invention relates to a method of manufacturing dynamic random access memory (DRAM). More particularly, the present invention relates to a method of manufacturing a crown-shaped DRAM capacitor.

2. Description of the Related Art

A capacitor is a major element in a dynamic random access memory (DRAM). To reduce erroneous readings and to increase operating efficiency, capacitance of the DRAM capacitors must be increased. Capacitance of a DRAM capacitor can be increased by enlarging the effective surface area. Effective surface area can be expanded by shaping the capacitor into a crown and forming hemispherical grains (HSGs) over the capacitor surface.

The conventional method of forming a crown-shaped capacitor includes filling with photoresist, chemical-mechanical polishing (CMP) and wet etching. FIGS. 1A through 1D are schematic cross-sectional views showing the steps for producing a conventional crown-shaped DRAM capacitor. In FIG. 1A, a silicon substrate 100 after with photoresist is shown. A dielectric layer 110, a nitride layer 120, a plug 160, a patterned oxide layer 130 and a polysilicon layer 140a shaped into a crown are already formed over the silicon substrate 100 having a region 102. After filling with photoresist, the crown-shaped polysilicon layer 140a is covered by a photoresist layer 150. The photoresist layer 150 is able to resist the intrusion of slurry into the crown-shaped area during chemical-mechanical polishing.

FIG. 1B shows the structure in FIG. 1A after a chemical-mechanical polishing operation. As shown in FIG. 1B, a portion of the photoresist layer 150 and polysilicon layer 140a are removed to form an embedded crown-shaped polysilicon capacitor 140b.

FIG. 1C shows the structure in FIG. 1B after the removal of the photoresist layer 150 and the removal of the oxide layer 130 by wet etching. A crown-shaped capacitor 140b is shown above the substrate 100.

After forming the crown-shaped capacitor 140b, a layer of hemispherical grains 170 is grown over the surface of the capacitor as shown in FIG. 1D. Since the hemispherical grains can grow on the surface of the crown-shaped capacitor 140b as fast as the nitride layer 120, many hemispherical grains 170 are also formed over the nitride layer 120.

However, the aforementioned method of forming a crown-shaped capacitor has a few drawbacks. The steps involved are complicated, thereby increasing both production time and cost. In addition, selectivity of hemispherical grain growth is low. Hence, some of the hemispherical grains are likely to form over the nitride layer resulting in unwanted short-circuiting.

SUMMARY OF THE INVENTION

The invention provides a method of manufacturing a crown-shaped DRAM capacitor. A silicon substrate structure is first provided. The silicon substrate structure includes an oxide layer over the substrate and a polysilicon layer over the oxide layer. The polysilicon layer further includes a plug that penetrates the oxide layer. A patterned photoresist layer is next formed over the polysilicon layer. Spacers having a low etching rate are formed over the sidewalls of the photoresist layer by carrying out a chemical reaction next to the sidewalls of the photoresist layer. A dry etching operation is carried out to etch the unreacted photoresist layer and the polysilicon layer exposed by the openings in the photoresist layer. Using the spacers as an etching mask, a portion of the polysilicon layer under the photoresist layer is removed by continuing the dry etching operation. Finally, the spacers are removed to complete the operations necessary for forming the crown-shaped capacitor.

One condition of the etching operation that must be satisfied is that the etching rates of the oxide layer and the spacers should be much lower than the etching rates of the photoresist layer and the polysilicon layer. In addition, the spacers are preferably polymers formed by plasma polymerization. An advantage of the design is that the same plasma for dry etching is also used for plasma polymerization. Ultimately, the growth of spacers on the sidewalls of the photoresist layer and the dry etching operation can be combined and performed in the same step. Furthermore, the polysilicon layer under the photoresist layer is etched to a depth controlled by timing (rather than by the detection of etching stop). Hence, a crown-shaped capacitor having a suitable bottom thickness is more easily formed.

To attain a higher capacitance for the crown-shaped capacitor, hemispherical grains are grown on the surface of the capacitor so that effective surface area is further increased.

In the aforementioned method of manufacturing a crown-shaped capacitor, separate mechanisms are used to form the external profile, the bottom section and the crown section.

Since the etching rate of polysilicon exposed by the openings in the photoresist layer is the fastest, that portion of the polysilicon layer is removed the earliest to form the external profile of the crown-shaped capacitor.

Because the polysilicon layer under the photoresist layer is exposed only after the photoresist layer (not including the sidewall spacers) is completely removed, this portion of the polysilicon layer is etched a little later. Hence, a definite thickness of the polysilicon layer remains under the originally photoresist-covered region when all the polysilicon material under the openings is removed. This remaining portion of the polysilicon layer under the photoresist-covered region becomes the bottom section of the crown-shaped capacitor.

The etching rate of spacers is much lower than the etching rate of the polysilicon layer and the photoresist layer. Therefore, little of the spacer material is removed. Since the polysilicon layer under the spacers is well protected by the spacers, the crown section of the crown-shaped capacitor is hereby formed.

In addition, the etching rate of the oxide layer is much lower than that of the polysilicon layer and the photoresist layer. Hence, very little damage to the oxide layer occurs within the period starting from the complete removal of the polysilicon material under the opening to the end of the polysilicon etching in the photoresist-covered region.

Moreover, since the polysilicon etching process is controlled by timing, thickness of the bottom section of the crown-shaped capacitor is adjustable.

In other words, this invention utilizes the time differences in the initiation of etching in different portions of the polysilicon layer together with controlled timing to form a crown-shaped capacitor in a single dry etching operation. Unlike the conventional method, there is no need to perform photoresist filling, chemical-mechanical polishing or a wet etching operation in sequence. Hence, the number of processing steps and production cost is reduced. Another difference with the conventional method is that the crown-shaped capacitor is formed above an oxide layer. Since hemispherical grains grow much faster on polysilicon than oxide, most of the hemispherical grains grow on the crown-shaped polysilicon surface instead of the adjacent oxide layer. Thus, short-circuiting with nearby devices is greatly reduced.

Accordingly, the present invention provides a method of manufacturing crown-shaped DRAM capacitor capable of reducing the number of processing steps so that production time and cost can be minimized. In addition, the invention provides a method of manufacturing crown-shaped DRAM capacitor capable of preventing an internal short-circuit due to the growth of hemispherical grains over capacitor surface. Hence, a more stable DRAM product can be obtained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
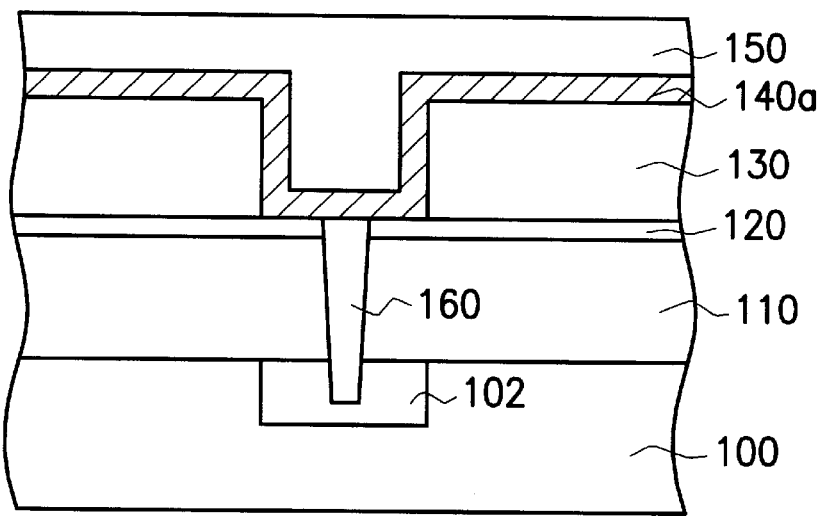
FIGS. 1A through 1D are schematic cross-sectional views showing the steps for producing a conventional crown-shaped DRAM capacitor.
Figure 1B:
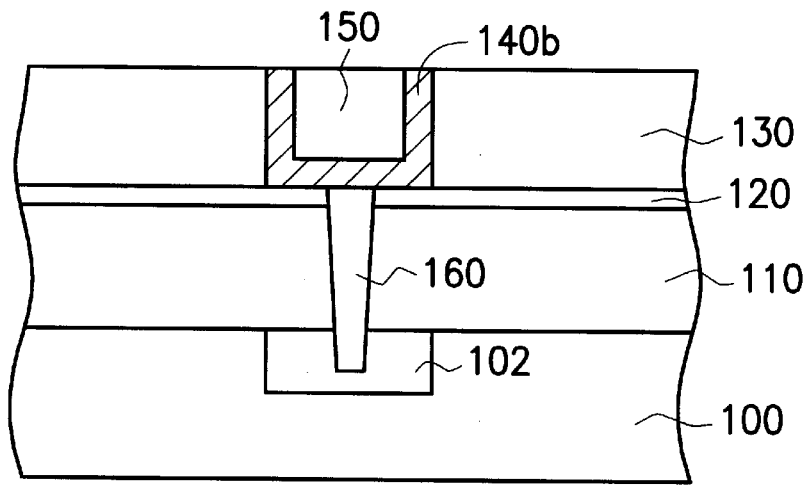
Figure 1C:
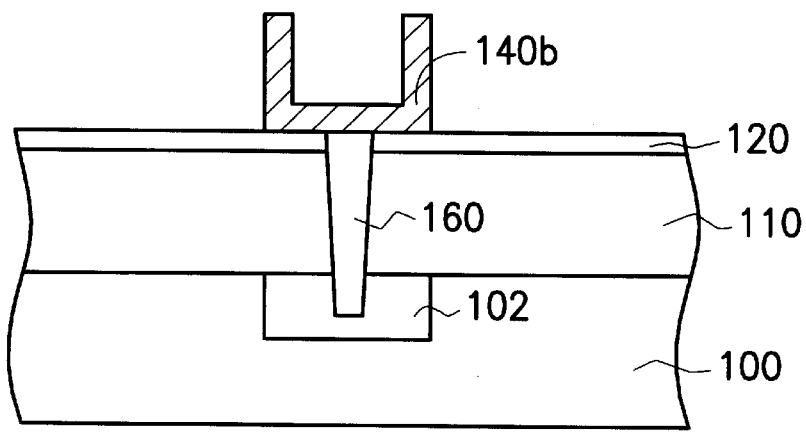
Figure 1D:
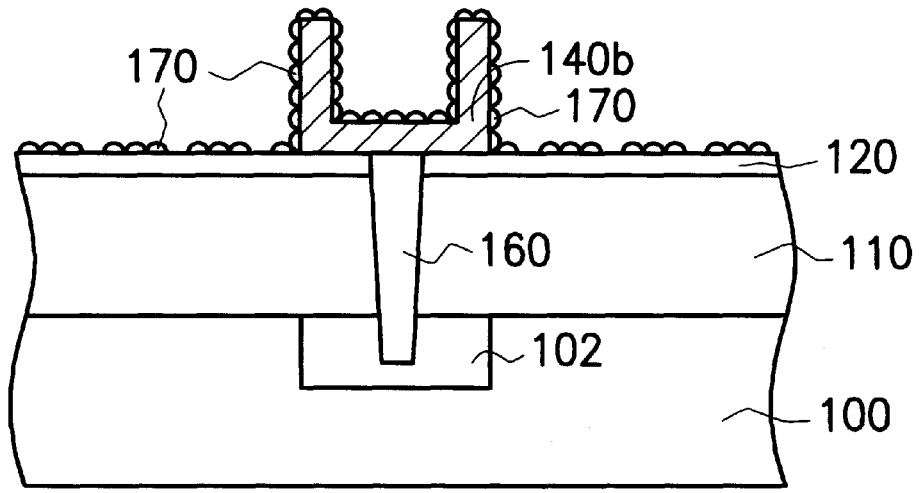

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic cross-section views showing the steps for producing a crown-shaped DRAM capacitor according to one preferred embodiment of this invention.

Figure 2A:
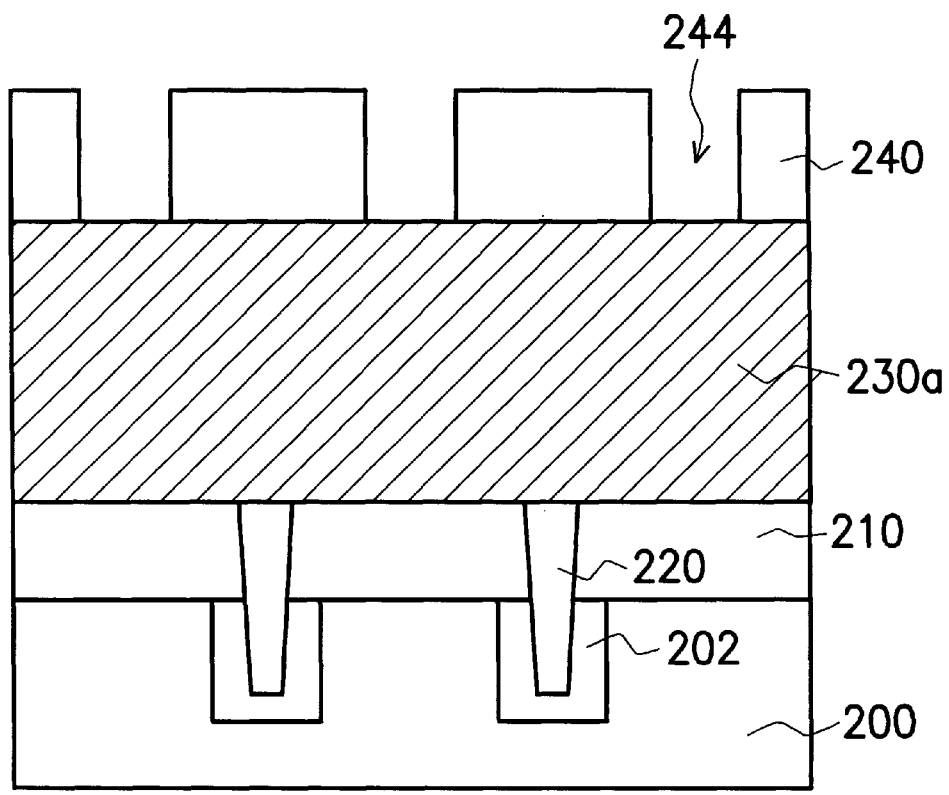
FIGS. 2A through 2E are schematic cross-section views showing the steps for producing a crown-shaped DRAM capacitor according to one preferred embodiment of this invention.

In FIG. 2A, the cross-sectional structure after a patterned photoresist layer 240 is formed over a silicon substrate 200 having a region 202 is shown. There is an oxide layer 210 over the substrate 200 and a polysilicon layer 230a over the oxide layer 210. In addition, there is a plug 220 underneath the polysilicon layer 230a. The plug 220 penetrates through the oxide layer. The patterned photoresist layer 240 includes openings 244 that define the desired position for forming the crown-shaped capacitor.

Figure 2B:
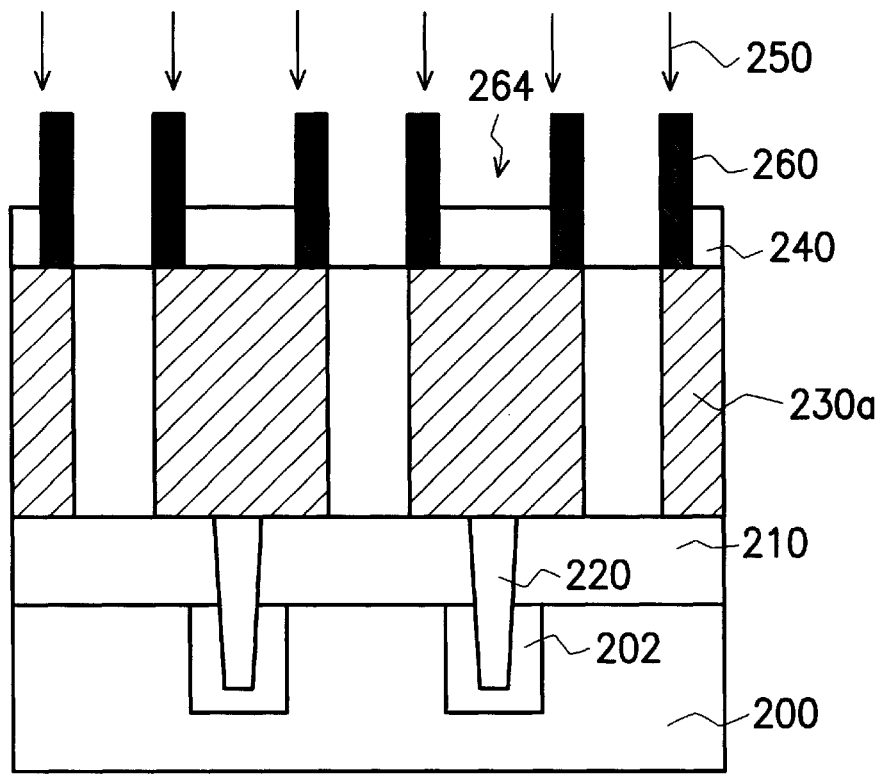

FIG. 2B is a diagram showing the structure in FIG. 2A undergoing plasma etching while polymer accumulates on the sidewalls of the photoresist layer 240 to form polymer spacers 260. As shown in FIG. 2B, the polysilicon material under the openings 244 has been completely removed. Only a thin photoresist layer 240 remains under the opening 264. The polymeric spacers 260 are formed by a polymerization reaction between the plasma and the material on the sidewalls of the photoresist layer 240. The polymeric spacers 260 remain on top of the polysilicon layer 230A as shown in FIG. 2B because etching rate of the polymeric material is much lower than either the photoresist layer 240 or the polysilicon layer 230a.

Note that only a small portion of the photoresist layer 240 is shown in FIG. 2B for the convenience of understanding the relationship between the photoresist layer 240 and the polymeric spacers 260. According to the thickness of the photoresist layer 240 and the etching rate, time for the complete removal of the photoresist layer 240 may be earlier than or about the same as the time needed to remove the polysilicon material under the openings 244.

In the embodiment of this invention, the mechanism for forming the polymeric spacers 260 is a plasma polymerization reaction. The plasma polymerization reaction occurs on the sidewalls of the photoresist layer 240 because of the difference in etching rates and polymerization rates in different portions of the photoresist layer 240. Plasma dry etching is an anisotropic etching reaction. Hence, sidewalls of the photoresist layer 240 are subjected to only a small amount of plasma ion bombardment. Since only a small amount of plasma ions is needed to initiate a polymerization reaction, the polymerization rate is much higher than the etching rate. In other words, a polymeric layer can easily form on the sidewalls of the photoresist layer 240. On the other hand, plasma ions come down mostly in a vertical direction perpendicular to the top surface of the photoresist layer 240. Consequently, etching rate in the mid-portion of the photoresist layer 240 is much higher than the polymerization rate and polymeric material accumulates only with difficulty.

In addition, the etching rate for the oxide layer 210 is much lower than the etching rates of the photoresist layer 240 and the polysilicon layer 230a. Hence, very little damage to the oxide layer occurs within the period starting from the complete removal of the polysilicon material under the openings 244 to the end of the polysilicon etching in the photoresist-covered region.

Figure 2C:
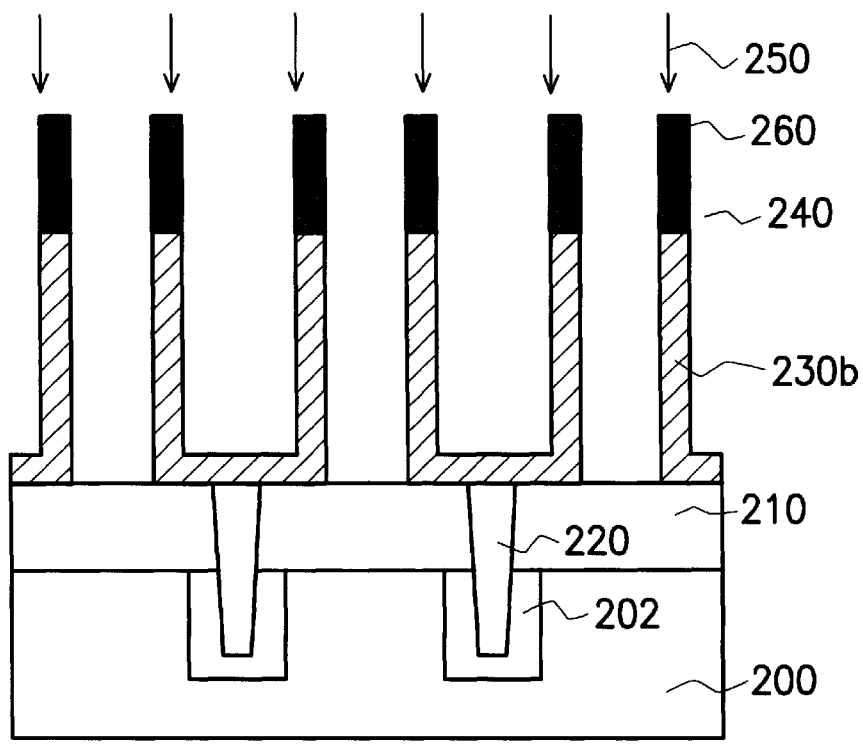

Plasma etching continues as shown in FIG. 2C, and finally a crown-shaped capacitor 230b is formed over the oxide layer 210. The remaining polysilicon layer under the openings 264 becomes the bottom section of the crown-shaped capacitor 230b. Thickness of the bottom section of the crown-shaped capacitor 230b can be adjusted by controlling the etching period.

Figure 2D:
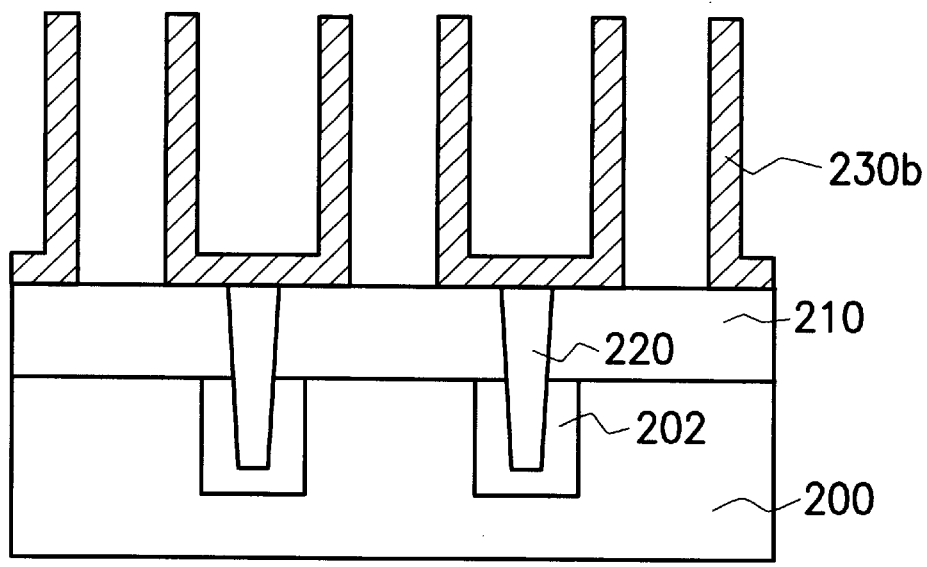
Figure 2E:
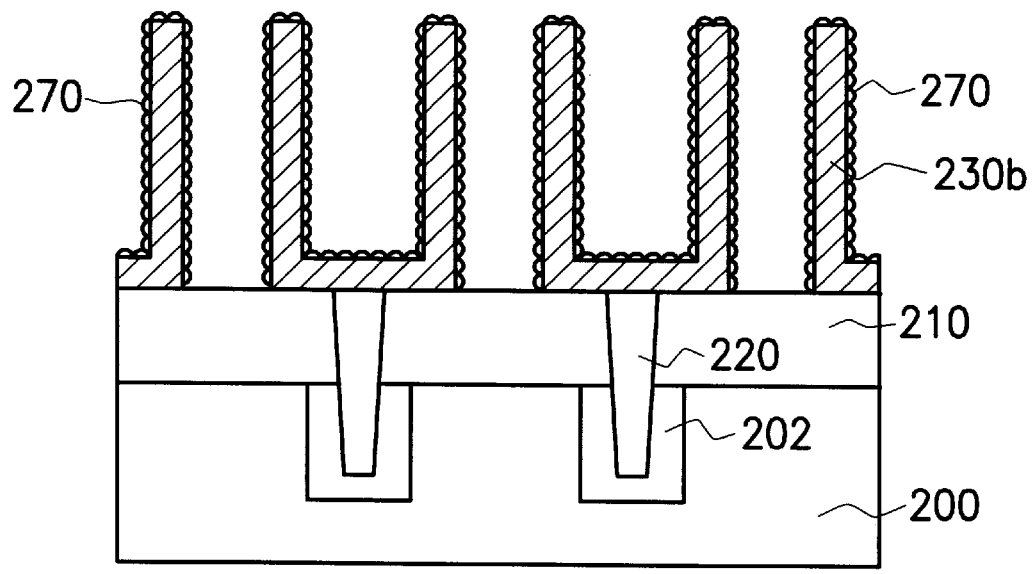

The polymeric spacers 260 above the crown-shaped capacitor 230b are removed as shown in FIG. 2D. Hemispherical grains 270, as shown in FIG. 2E, are next formed over the exposed surfaces of the polysilicon crown 230b. Since the growth rate of hemispherical grains 270 over polysilicon material is much higher than the oxide layer 210, most of the hemispherical grains 270 will accumulate on the crown-shaped capacitor 230b with little on the oxide layer 210.

In summary, this invention relies on plasma etching and plasma polymerization properties as well as different etching rates for different material to obtain the crown-shaped capacitor 230b in very few steps. Because the main reaction on the sidewalls of the photoresist layer 240 is polymerization, etch-resistant polymeric spacers 260 are formed. The polysilicon material under the openings 244 is removed the earliest. This is followed by the complete removal of polysilicon material under the openings 264 because this portion of the polysilicon layer 230a is covered by the photoresist layer 240. The portion of polysilicon layer 230a under the polymeric spacers 260 remains intact after the plasma etching operation. Hence, the crown-shaped capacitor 230b of this invention can be formed in a single plasma etching operation. In addition, the etching rate of the oxide layer 210 is much lower than the etching rates of the photoresist layer 240 and the polysilicon layer 230a. Furthermore, bottom section thickness of the crown-shaped capacitor 230b can be varied by controlling the etching time. Hence, high-quality crown-shaped capacitors can be easily obtained.

Another advantage of this invention is that the hemispherical grains 270 have a much higher growth rate on the polysilicon crown 230b than on the oxide layer 210. Therefore, very few hemispherical grains 270 are grown over the oxide layer 210 and the possibility of short-circuiting is greatly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a capacitor of a dynamic random access memory, comprising the steps of:

providing a silicon substrate structure, wherein the silicon substrate structure includes an oxide layer over a substrate, a polysilicon layer over the oxide layer, and a plug under the polysilicon layer that penetrates through the oxide layer;

forming a patterned photoresist layer over the polysilicon layer, wherein the patterned photoresist layer includes a first set of openings;

conducting a chemical reaction next to the sidewalls of the photoresist layer so that spacers are formed;

removing the polysilicon layer under the first set of openings by dry etching;

removing the photoresist layer between the spacers in the dry etching operation so that a second set of openings between the spacers is formed;

removing a portion of the polysilicon layer under the second set of openings by continuing the dry etching operation while using the spacers as a mask so that a polysilicon layer having a desired thickness remains under the second set of openings; and removing the spacers to form a crown-shaped capacitor.

2. The method of claim 1, wherein an etching rate of the spacers is much lower than etching rates of the polysilicon layer and the photoresist layer.

3. The method of claim 2, wherein the spacers include polymeric spacers.

4. The method of claim 3, wherein the step of forming the polymeric spacers includes performing a plasma polymerization.

5. The method of claim 1, wherein an etching rate of the oxide layer is much lower than etching rates of the polysilicon layer and the photoresist layer.

6. The method of claim 1, wherein the step of adjusting a thickness of the remaining polysilicon layer under the second set of openings includes controlling etching time.

7. The method of claim 1, wherein after the step of removing the spacers, further includes growing hemispherical grains over the polysilicon crown-shaped capacitor.

8. The method of claim 7, wherein a growth rate of hemispherical grains over the polysilicon crown-shaped capacitor is much higher than a growth rate of the oxide layer.

9. A method of manufacturing a capacitor of a dynamic random access memory, comprising the steps of:

providing a silicon substrate structure, wherein the silicon substrate structure includes an oxide layer over a substrate, a polysilicon layer over the oxide layer, a plug under the polysilicon layer that penetrates through the oxide layer;

forming a patterned photoresist layer over the polysilicon layer, wherein the patterned photoresist layer includes a first set of openings;

conducting a dry etching operation so that plasma polymerization occurs next to the sidewalls of the photoresist layer to form polymeric spacers;

removing the polysilicon layer under the first set of openings by dry etching;

removing the photoresist layer between the polymeric spacers in the dry etching operation so that a second set of openings between the spacers is formed;

removing a portion of the polysilicon layer under the second set of openings by continuing the dry etching operation using the polymeric spacers as a mask so that a polysilicon layer having a desired thickness remains under the second set of openings; and removing the polymeric spacers to form a crown-shaped capacitor.

10. The method of claim 9, wherein an etching rate of the oxide layer is much lower than etching rates of the polysilicon layer and the photoresist layer.

11. The method of claim 9, wherein an etching rate of the polymeric spacers is much lower than etching rates of the polysilicon layer and the photoresist layer.

12. The method of claim 9, wherein the step of adjusting a thickness of the remaining polysilicon layer under the second set of openings includes controlling an etching time.

13. The method of claim 9, wherein after the step of removing the spacers, further includes growing hemispherical grains over the polysilicon crown-shaped capacitor.

14. The method of claim 13, wherein a growth rate of hemispherical grains over the polysilicon crown-shaped capacitor is much higher than a growth rate on the oxide layer.

* * * * *